(12) United States Patent
Hao et al.

(10) Patent No.: US 8,737,071 B2
(45) Date of Patent: May 27, 2014

(54) HEAT DISSIPATION DEVICE

(75) Inventors: Mingliang Hao, Shenzhen (CN); Jun Zhao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 302 days.

(21) Appl. No.: 13/338,713

(22) Filed: Dec. 28, 2011

(65) Prior Publication Data

US 2012/0120604 A1 May 17, 2012

Related U.S. Application Data

(63) Continuation of application No. PCT/CN2011/074163, filed on May 17, 2011.

(30) Foreign Application Priority Data

Nov. 11, 2010 (CN) .......................... 2010 1 0539910

(51) Int. Cl.
*H05K 7/20* (2006.01)
*F28D 15/00* (2006.01)
*G06F 1/20* (2006.01)

(52) U.S. Cl.
CPC *H05K 7/20* (2013.01); *F28D 15/00* (2013.01); *G06F 1/20* (2013.01)
USPC ................. 361/700; 361/679.52; 361/679.53; 361/698; 361/699; 361/107; 165/80.4; 165/104.21; 165/104.26; 165/104.33; 174/15.1

(58) Field of Classification Search
CPC ........ H05K 7/20; H05K 7/2033; F28D 15/02; F28D 15/00; F28D 7/00; H01L 21/00; G06F 19/10; G06F 1/20
USPC ............... 361/679.46–679.54, 688, 689, 698, 361/699, 700–712, 714, 715, 717–724; 165/80.2, 80.4, 80.5, 104.19, 104.21, 165/104.22, 104.33, 104.34, 148, 185; 257/712, 714, 715, 721, 722; 174/15.2, 174/16.3
See application file for complete search history.

(56) References Cited

U.S. PATENT DOCUMENTS 5,216,580 A * 6/1993 Davidson et al. ............. 361/700
5,390,077 A * 2/1995 Paterson ....................... 361/700
(Continued)

FOREIGN PATENT DOCUMENTS

| CN | 2494037 Y | 5/2002 |
| CN | 2720630 Y | 8/2005 |

(Continued)

OTHER PUBLICATIONS

First Office Action (translation) of Chinese Application No. 201010539910.9; dated (mailed) Dec. 7, 2011; Chinese version attached; (15 pgs.).

(Continued)

*Primary Examiner* — Michail V Datskovskiy

(57) ABSTRACT

A heat dissipation device is provided in the present disclosure, where the heat dissipation device includes a hollow heat-sink base and a set of fluid tube. The fluid tube is inserted in the heat-sink base, and a cooling medium circulates in the fluid tube. The heat-sink base includes a heat absorption area configured to absorb heat. A cooling fluid, received in the heat-sink base, may be vaporized at the heat absorption area to absorb the heat taken by the heat absorption area, and condensed at a position that is inside the heat-sink base and away from the heat absorption area and on the fluid tube to release the absorbed heat.

19 Claims, 3 Drawing Sheets

(56) References Cited

U.S. PATENT DOCUMENTS

| | | | |
|---|---|---|---|
| 5,529,115 A * | 6/1996 | Paterson | 165/104.33 |
| 5,694,295 A * | 12/1997 | Mochizuki et al. | 361/699 |
| 6,490,160 B2 * | 12/2002 | Dibene et al. | 361/700 |
| 6,550,531 B1 * | 4/2003 | Searls et al. | 165/104.33 |
| 6,588,498 B1 * | 7/2003 | Reyzin et al. | 165/104.33 |
| 6,918,431 B2 * | 7/2005 | Reyzin et al. | 165/104.21 |
| 6,994,151 B2 * | 2/2006 | Zhou et al. | 165/80.4 |
| 7,077,189 B1 * | 7/2006 | Reyzin et al. | 165/80.4 |
| 7,246,655 B2 * | 7/2007 | Mochizuki et al. | 165/104.26 |
| 7,369,410 B2 * | 5/2008 | Chen et al. | 361/701 |
| 7,435,622 B2 * | 10/2008 | Colbert et al. | 438/118 |
| 7,540,319 B2 * | 6/2009 | Mochizuki et al. | 165/104.26 |
| 7,556,089 B2 * | 7/2009 | Bhatti et al. | 165/104.33 |
| 7,796,389 B2 * | 9/2010 | Edmunds et al. | 361/700 |
| 7,965,511 B2 * | 6/2011 | Refai-Ahmed | 361/700 |
| 7,974,096 B2 * | 7/2011 | Refai-Ahmed | 361/700 |
| 8,091,614 B2 * | 1/2012 | Martin et al. | 165/80.4 |
| 2002/0056908 A1 * | 5/2002 | Brownell et al. | 257/714 |
| 2002/0118511 A1 * | 8/2002 | Dujari et al. | 361/703 |
| 2005/0173098 A1 * | 8/2005 | Connors | 165/104.33 |
| 2007/0227703 A1 * | 10/2007 | Bhatti et al. | 165/104.26 |
| 2007/0258213 A1 | 11/2007 | Chen et al. | |
| 2008/0110594 A1 * | 5/2008 | Martin et al. | 165/80.4 |
| 2008/0135297 A1 | 6/2008 | Gavia | |
| 2010/0078153 A1 | 4/2010 | Siu | |

FOREIGN PATENT DOCUMENTS

| | | |
|---|---|---|
| CN | 1668886 A | 9/2005 |
| CN | 1783466 A | 6/2006 |
| CN | 1909771 A | 2/2007 |
| CN | 2877208 Y | 3/2007 |
| CN | 1946276 A | 4/2007 |
| CN | 101256992 A | 9/2008 |
| CN | 101466228 A | 6/2009 |
| CN | 201422221 Y | 3/2010 |
| CN | 101826493 A | 9/2010 |
| JP | 2002-280506 A | 9/2002 |

OTHER PUBLICATIONS

International Search Report from the Chinese Patent Office for corresponding International Application No. PCT/CN2011/074163 mailed Aug. 25, 2011.

* cited by examiner

HEAT DISSIPATION DEVICE

CROSS-REFERENCE TO RELATED APPLICATIONS

This application is a continuation of International Application No. PCT/CN2011/074163, filed on May 17, 2011, which claims priority to Chinese Patent Application No. 201010539910.9, filed with the Chinese Patent Office on Nov. 11, 2010 and entitled "HEAT DISSIPATION DEVICE", both of which are incorporated herein by reference in its entirety.

FIELD OF THE INVENTION

The present disclosure relates to the field of communications, and in particular, to a heat dissipation device.

BACKGROUND OF THE INVENTION

With miniaturization and increasing computing speed, electronic components and electronic devices emit more and more heat, and if the heat cannot be dissipated in time, operational performance of the electronic components is adversely affected. A heat dissipation device is a device for rapidly dissipating heat generated by a heat source in an electronic product. Currently, the types of heat dissipation devices are diversified, which adopt, for example, a heat-sink fin set, a heat pipe, a fan, or a liquid cooling manner.

These heat dissipation devices have low cooling efficiency, and the heat dissipation devices fail easily and have low reliability, which thereby threatens safe operation of electronic products.

SUMMARY OF THE INVENTION

Embodiments of the present disclosure provide an efficient and reliable heat dissipation device.

An embodiment of the present disclosure provides a heat dissipation device, where the heat dissipation device includes a hollow heat-sink base and a set of fluid tube. The fluid tube is inserted in the heat-sink base, and a cooling medium circulates in the fluid tube. The heat-sink base includes a heat absorption area configured to absorb heat. A cooling fluid is received within the heat-sink base, where the cooling fluid may be vaporized at the heat absorption area to absorb the heat absorbed by the heat absorption area, and condensed at a position that is inside the heat-sink base and away from the heat absorption area and on the fluid tube to release the absorbed heat.

An embodiment of the present disclosure provides an electronic equipment equipped with the heat dissipation device for cooling the electronic equipment.

In the heat dissipation device according to the embodiments of the present disclosure, the fluid tube and the heat-sink base are combined with each other, which improves the heat dissipation efficiency of the heat dissipation device and meanwhile decreases the risk that failure of a single fluid tube or heat-sink base causes failure of the entire heat dissipation device, and thereby enhances the reliability of the heat dissipation device.

DETAILED DESCRIPTION OF THE EMBODIMENTS

Figure 1:
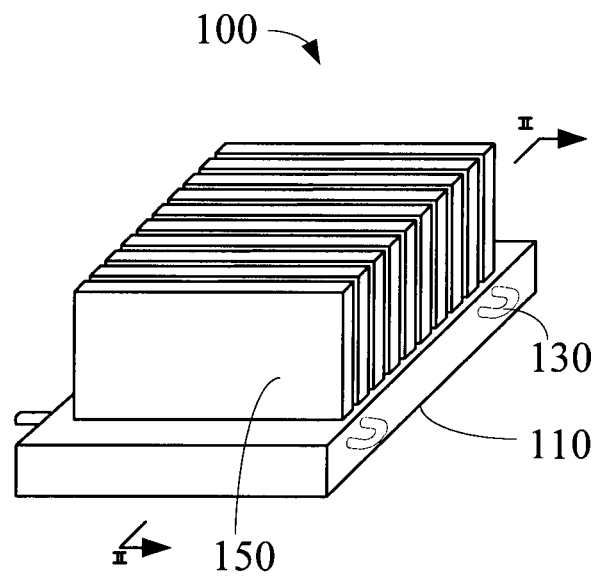
FIG. 1 is a schematic three-dimensional diagram of a heat dissipation device according to a first embodiment of the present disclosure.

FIG. 1 is a schematic three-dimensional diagram of a heat dissipation device 100 according to a first embodiment of the present disclosure. The heat dissipation device 100 includes a heat-sink base 110 and a set of fluid tube 130. The fluid tube 130 is inserted in the heat-sink base 110, and a cooling medium circulates in the fluid tube 130. The heat-sink base 110 includes a heat absorption area 112, configured to contact with a heat source 170 (see FIG. 2) of an electronic device to absorb heat generated by the heat source 170. A cooling fluid 115 is set within the heat-sink base 110, where the cooling fluid 115 can be vaporized at the heat absorption area 112 to absorb heat of the heat absorption area 112. The cooling medium circulating in the fluid tube 130 is configured to take away the heat absorbed by the fluid tube 130.

Figure 2:
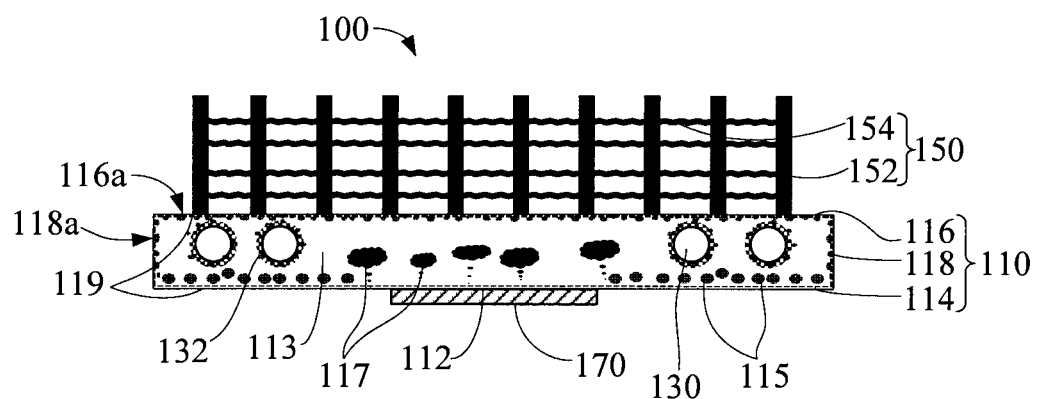
FIG. 2 is a cross section diagram of the heat dissipation device in FIG. 1 along a II-II direction.

Referring to FIG. 2, the heat-sink base 110 includes a bottom plate 114, a top plate 116 corresponding to the bottom plate 114, and multiple side plates 118 vertically connected the bottom plate 114 with the top plate 116. The bottom plate 114, the top plate 116, and the side plates 118 are hermetically connected, thereby cooperatively forming a sealed steam chamber 113. The cooling fluid 115 is received in the steam chamber 113. The heat absorption area 112 is formed on the bottom plate 114, and may be any area on the bottom plate 114, or a specific area set on the bottom plate 114 and made of a high thermal conductivity material such as aluminum, copper, aluminum alloy, or graphite. The heat absorption area 112 is configured to contact with the heat source 170, absorb the heat generated by the heat source 170, and conduct the heat to the cooling fluid 115 converging in the heat absorption area 112. After the heat absorbed by the cooling fluid 115 accumulates to the amount required by the cooling fluid 115 to undergo an evaporation phase change, the cooling fluid starts vaporizing gradually to form steam 117, and the steam 117 is spread in the entire steam chamber 113. When reaching the top plate 116, the side plates 118, or the fluid tube 130 of a lower temperature, the steam 117 is condensed, and conducts the heat to a surface of an object contacting with the steam 117 during the condensation, and the object contacting with the steam 117 takes the heat away. In order to decrease gas flow resistance and thermal resistance and lower a boiling point of the cooling fluid in the steam chamber 113, the steam chamber 113 may be evacuated into a vacuum state, which thereby enables the steam 117 to flow more smoothly and meanwhile achieves a better effect of heat dissipation by thermal radiation. In addition, in order to enable the condensed cooling fluid 115 to flow back to the heat absorption area 112 of the bottom plate 114 rapidly, a capillary structure 119 may be set on inner walls of the bottom plate 114, the top plate 116, and the side plates 118, which thereby increases a fluid returning speed after the steam 117 is condensed. The capillary structure 119 guides the condensed cooling fluid to the heat absorption area 112 rapidly through a capillary siphon effect, thereby increasing a phase change circulation rate of the cooling fluid 115 to improve the heat dissipation efficiency. The capillary structure 119 may be a sintered copper powder layer, or grooves or small channels formed by etching, or a metal mesh, but the present disclosure is not limited thereto.

The fluid tube 130 is a cooling medium circulation channel made of a thermally conductive material. In this embodiment, the fluid tube 130 is inserted into the steam chamber 113 through the side plate 118 of the heat-sink base 110, but the present disclosure is not limited thereto. The fluid tube 130 may also be inserted into the steam chamber 113 through the top plate 114 or the bottom plate of the heat-sink base 110. Furthermore, in this embodiment, the fluid tube 130 is set in the steam chamber 113 between the bottom plate 114 and the top plate 116 in a suspended manner. In this embodiment, the fluid tube 130 is designed in a serpentine shape bending back and forth, so as to increase an area of the fluid tube 130 in the steam chamber 113 to absorb more heat. The fluid tube 130 may also be designed in a straight line shape running through the steam chamber 113 according to requirements; or designed in the serpentine shape bending back and forth in a heat concentration area in the hot steam chamber 113, and in the straight line shape elsewhere, so as to increase a utilization rate of the fluid tube 130. In order to enable the cooling fluid 115 condensed on an outer wall of the fluid tube 130 to flow back to the heat absorption area 112 rapidly, a fluid tube capillary structure 132 may be set on the outer wall of the fluid tube 130 in the steam chamber 113. The fluid tube capillary structure 132 may be manufactured by using the same method as the capillary structure 119. According to different application scenarios and heat dissipation requirements, a cross section of the fluid tube 130 may be round, or oval, that is, oblong. In addition, the fluid tube 130 received within the steam chamber 113 may also be directly supported on an inner surface of the bottom plate 114, so as to make the heat pipe 130 closer to the heat source 170 and meanwhile reduce a fluid returning distance of the condensed cooling fluid 115, which thereby increases the phase change circulation rate of the cooling fluid 115 to further improve the heat dissipation efficiency of the heat dissipation device 100.

In order to improve the heat dissipation efficiency of the heat dissipation device 100, the heat dissipation device may further include a heat-sink fin set 150. The heat-sink fin set 150 is set in a position inside the heat-sink base 110 away from the heat absorption area 112, and is configured to dissipate part of the heat that is absorbed by the heat-sink base 110 through the heat absorption area 112, into an ambient space of the heat-sink fin set 150. The heat-sink fin set 150 is made of a material of high thermal conductivity, is a regularly arranged heat dissipation structure, and in this embodiment is formed by multiple regularly arranged heat-sink fins 152. The heat-sink fins 152 are set on an outer surface 116a of the top plate 116 in a substantially vertical manner, so as to rapidly dissipate the heat on the top plate 116 and the side plates 118 to ambient air of the heat-sink fins 152. It can be understood that, according to requirements, the heat-sink fins 152 may also be set on outer surfaces 118a of the side plates 118, or set on the outer surfaces 116a and 118a of the top plate 116 and the side plates 118 at the same time. In order to improve the heat dissipation efficiency of the heat-sink fin set 150, adjacent heat-sink fins 152 are interconnected by heat dissipation plates 154 to increase a heat dissipation area of the heat-sink fin set 150, which thereby improves the heat dissipation efficiency. The number of the heat dissipation plate 154 between each two adjacent heat-sink fins 154 may be only one, and may also be multiple according to requirements. The heat dissipation plate 154 in this embodiment is wave-like, but is not limited to the shape. According to different requirements, the heat dissipation plate 154 may be designed to be flat or other structures that may increase the heat dissipation area and is convenient for manufacturing the heat-sink fin set 150. An angle between the heat dissipation plate 154 and the heat-sink fin 152 connected to the heat dissipation plate 154 may be 90 degrees, which thereby forms multiple heat dissipation holes 156 on the heat-sink fin set 150 with cross sections of the holes being approximately square. The angle between the heat dissipation plate 154 and the heat-sink fin 152 connected to the heat dissipation plate 154 may be any angle that is designed according to requirements and satisfies the connection demand of the heat-sink fin 152. For example, the connection angle may be 60 degrees or 45 degrees, which thereby forms multiple heat dissipation holes on the heat-sink fin set 150 with cross sections of the holes being approximately triangular. It can be understood that the heat-sink fin set 150 is an optionally designed structure, and if the heat dissipation device 100 can meet the heat dissipation requirements through the heat-sink base 110 and the fluid tube 130, the heat-sink fin set 150 may be removed from the heat dissipation device 100, which achieves the object of reducing volume and saving cost.

In use, the heat dissipation device 100 is set on the heat source 170 through the heat-sink base 110, and the heat absorption area 112 and the heat source 170 are designed to contact with each other, so that the heat source can transfer the heat to the heat absorption area 112. The heat absorption area 112 of the heat-sink base 110 transfers the absorbed heat to the cooling fluid 115 converging in the heat absorption area 112. After absorbing enough heat, the cooling fluid 115 undergoes the phase change and turns into the steam 117. The steam 117 is spread in the entire steam chamber 113. When reaching the top plate 116, the side plates 118, and the fluid tube 130 of a lower temperature, the steam 117 is condensed to change again into the cooling fluid 115 in a liquid state. During the condensation, the heat absorbed by the steam 117 is transferred to the top plate 116, the side plates 118, and the fluid tube 130. A part of the heat absorbed by the top plate 116 and the side plates 118 is transferred to the heat-sink fins 152 and the heat dissipation plate 154 of the heat-sink fin set 150 by the manner of thermal conduction, and is dissipated into an ambience by the heat-sink fins 152 and the heat dissipation plate 154. The other part of the heat is dissipated to the outside by the top plate and the side plates by thermal air convection and thermal radiation. The heat absorbed by the fluid tube 130 is taken away by the heat dissipation medium circulating in the fluid tube 130. The cooling fluid 115 formed after the steam 117 is condensed rapidly flows back to the heat absorption area 112 along the fluid tube capillary structure 132 of the fluid tube 130 and the capillary structure 119 in the heat-sink base 110, and is vaporized again. The above process is repeated continuously in the heat dissipation device 100, so that the heat of the heat source 170 can be effectively dissipated to a position away from the heat source 170, which thereby achieves the objective of keeping a suitable working temperature. The cooling medium in the fluid tube 130 circulates continuously, so that it may be guaranteed that the temperature of the fluid tube 130 is in a state of being substantially constant, which thereby guarantees that the temperature of an electronic device is constant to achieve the objective of making the temperature of the electronic device controllable. Furthermore, by setting a suitable temperature, sweat by condensing is prevented from occurring on the electronic device, and meanwhile the steam 117 in the steam chamber 113 may be condensed rapidly, which increases a phase change rate of the steam and thereby improves the heat dissipation efficiency. Meanwhile, the fluid tube 130 and the heat-sink base 110 adopt different heat dissipation mechanisms, and are very unlikely to fail at the same time, which thereby dramatically reduces the risk incurred by failure of the heat dissipation device 100 due to the ambience or the use time, and enhances the reliability of the heat dissipation device 100.

Figure 3:
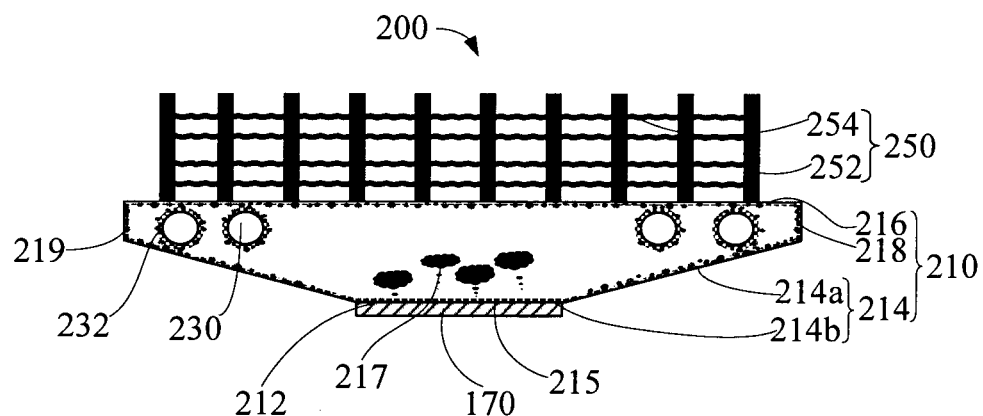
FIG. 3 is a cross section diagram of a heat dissipation device according to a second embodiment of the present disclosure.

FIG. 3 is a cross section diagram of a heat dissipation device 200 according to a second embodiment of the present disclosure. The heat dissipation device 200 includes a heat-sink base 210, a set of fluid tube 230, and an optionally equipped heat-sink fin set 250. The heat-sink base 210 includes a heat absorption area 212, configured to contact with a heat source 170 of an electronic device to absorb heat generated by the heat source 170. The fluid tube 230 is inserted in the heat-sink base 210, and a cooling medium circulating in the fluid tube 230 takes away heat absorbed by the fluid tube 230. The heat-sink fin set 250 is set in a position inside the heat-sink base 210 away from the heat absorption area 212, and is configured to dissipate a part of heat in the heat-sink base 210 to an ambient space of the heat-sink fin set 250. The heat dissipation device 200 according to the second embodiment of the present disclosure and the heat dissipation device 100 according to the first embodiment of the present disclosure are the same or similar in structure, and as described above, like numerals (for example, 110 and 220 are regarded as like numerals) are used to represent like components, so the structures and functions of like components in the first embodiment and the second embodiment are not repeated herein, and descriptions of the first embodiment may serve as a reference for details. Differences between the heat dissipation device 200 in the second embodiment and the heat dissipation device 100 in the first embodiment are as follows. A bottom plate 214 of the heat dissipation device 200 includes a fluid collecting plate 214a and a flowing back plate 214b connected to the fluid collecting plate 214a at an angle. The heat absorption area 212 is on the fluid collecting plate 214a. The fluid collecting plate 214a and the flowing back plate 214b cooperatively form a cone, a radius of which decreases gradually in a vertical downward direction. The structure enables a cooling fluid 215 having flowed back to an edge of the bottom plate 214, that is, an edge of the fluid collecting plate 214a, to flow back to the fluid collecting plate 214a faster under the action of gravity, so as to prevent the risk of "burning" of the heat absorption area 212 which may be caused by too rapid vaporization of the cooling fluid 215 in the heat absorption area 212; and also keeps areas, except the heat absorption area 212, on the bottom plate 214 away from electronic elements, to prevent the heat absorbed by the heat-sink base 210 from heating electronic elements besides the heat source through thermal radiation to incur "thermal pollution". In the second embodiment of the present disclosure, the bottom plate 214 of the heat dissipation device 200 is designed to be a cone, so as to increase the fluid returning rate of the cooling fluid 215 in the heat-sink base 210, meanwhile prevent thermal pollution and thereby further improve the heat dissipation efficiency and reliability of the heat dissipation device 200.

Figure 4:
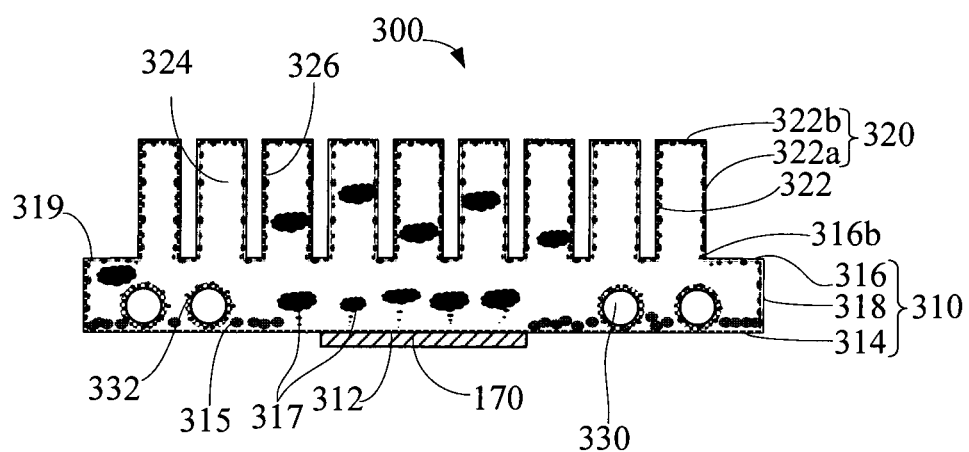
FIG. 4 is a cross section diagram of a heat dissipation device according to a third embodiment of the present disclosure.

FIG. 4 is a cross section diagram of a heat dissipation device 300 according to a third embodiment of the present disclosure. The heat dissipation device 300 includes a heat-sink base 310 and a set of fluid tube 330. The heat-sink base 310 includes a heat absorption area 312, configured to contact with a heat source 170 of an electronic device to absorb heat generated by the heat source 170. The fluid tube 330 is inserted in the heat-sink base 310, and a cooling medium circulating in the fluid tube 330 takes away heat absorbed by the fluid tube 330. Some structures in the heat dissipation device 300 according to the third embodiment of the present disclosure and some structures in the heat dissipation device 100 and the heat dissipation device 200 according to the first embodiment and the second embodiment of the present disclosure are the same or similar, and as described above, like numerals are used to represent like components, so the structures and functions of components in the third embodiment like those in the first embodiment and the second embodiment are not repeated herein, and descriptions of the first embodiment may serve as a reference for details. Differences between the heat dissipation device 300 in the third embodiment and the heat dissipation devices 100 and 200 in the first embodiment and the second embodiment are as follows.

The heat-sink base 310 further includes a heat-sink fin set 320 integrally formed with the heat-sink base 310. The heat-sink fin set 320 includes multiple hollow heat dissipation members 322 regularly arranged at even intervals. Each of the hollow heat dissipation members 322 includes multiple vertical plates 322a and a horizontal plate 322b. The vertical plates 322a of each of the hollow heat dissipation members 322 are connected end to end in sequence to form a closed ring having openings at two ends. One end of the closed ring formed by the multiple vertical plates 322a of each of the hollow heat dissipation members 322 is connected to a top plate 316 of the heat-sink base 310 in a substantially vertical manner. The horizontal plate 322b is connected to the other end of the closed ring formed by the vertical plates 322a, which thereby forms an accommodation space 324 between the horizontal plate 322b and the vertical plates 322a. The top plate 316 of the heat-sink base 310 corresponding to the accommodation spaces 324 of the hollow heat dissipation members 322 is opened with multiple openings 316b, so that the accommodation spaces 324 of the hollow heat dissipation members 322 are in communication with a steam chamber 313 of the heat-sink base 310 through the openings 316b. The fluid tube 330 is inserted in the steam chamber 313 through side plates 318 of the heat-sink base 310, and contacts with a bottom plate 314 of the heat-sink base 310. In the third embodiment of the present disclosure, the multiple hollow heat-sink fin set 320 arranged regularly and in communication with the steam chamber 313 of the heat-sink base 310 are set on the heat-sink base 310, so as to expand a space of the steam chamber 313 and meanwhile increase an area to which the steam 317 may adhere to be condensed, which further increases a phase change rate of a cooling fluid 315 and improves the heat dissipation efficiency. In order to enable the condensed cooling fluid 315 to flow back to the heat absorption area 312 rapidly, a heat dissipation member capillary structure 326 is set on inner surfaces of the vertical plates 322a and the horizontal plate 322b of each of the hollow heat dissipation members 322. The heat dissipation member capillary structure 326 makes the condensed cooling fluid 315 flow back to the heat absorption area faster through a siphon effect, which increases the phase change rate of the cooling fluid 315 and improves the heat dissipation efficiency of the heat dissipation device.

Figure 5:
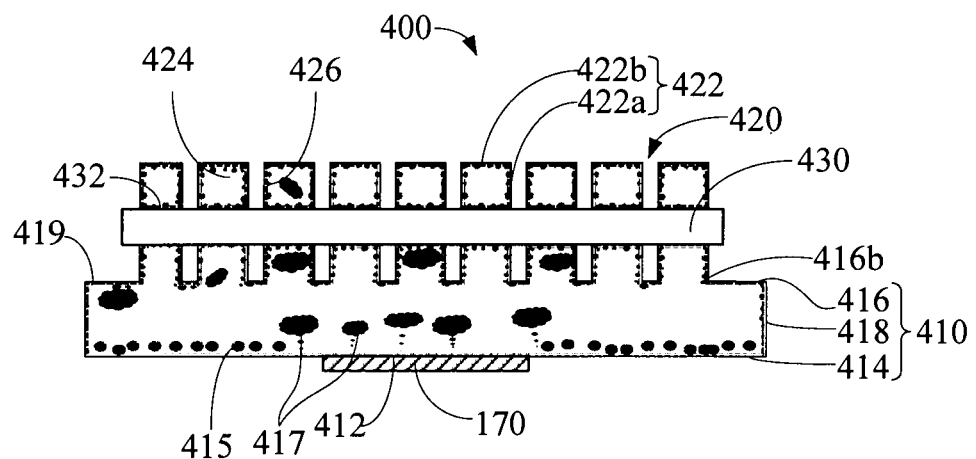
FIG. 5 is a cross section diagram of a heat dissipation device according to a fourth embodiment of the present disclosure.

FIG. 5 is a cross section diagram of a heat dissipation device 400 according to a fourth embodiment of the present disclosure. The heat dissipation device 400 includes a heat-sink base 410 and a set of fluid tube 430. The heat-sink base 410 includes a heat absorption area 412, configured to contact with a heat source 170 of an electronic device to absorb heat generated by the heat source 170. A heat-sink fin set 420 is formed on the heat-sink base 410, and the heat-sink fin set 420 includes multiple regularly arranged hollow heat dissipation members 422. Some structures in the heat dissipation device 400 according to the fourth embodiment of the present disclosure and some structures in the heat dissipation device 300 according to the third embodiment of the present disclosure are the same or similar, and as described above, like numerals are used to represent like components, so the structures and functions of like components in the third embodiment and the fourth embodiment are not repeated herein, and descriptions of the third embodiment may serve as a reference for details. Differences between the heat dissipation device 400 in the fourth embodiment and the heat dissipation device 300 in the third embodiment are as follows.

The fluid tube 430 runs through the heat-sink fin set 420. In this embodiment, the fluid tube 430 runs through opposite vertical plates 422a of each of the hollow heat dissipation members 422 in a substantially vertical manner, and a cooling medium in the fluid tube 430 takes away a part of heat in the heat-sink fin set 420. In this embodiment, the fluid tube 430 may not only take away the heat through the cooling medium, but also dissipate the heat to an ambient space through the tube parts exposed between the adjacent hollow heat dissipation members 422 by thermal radiation and thermal conduction, thereby improving the heat dissipation efficiency of the entire heat dissipation device. It can be understood that, the fluid tube 430 in the heat dissipation device 400 according to the fourth embodiment of the present disclosure may also adopt a combined setting manner in which the fluid tube 430 is set at the heat-sink fin set 420 and in a steam chamber 413 at the same time, and the combined manner may further improve the heat dissipation efficiency and reliability of the heat dissipation device 400.

Figure 6:
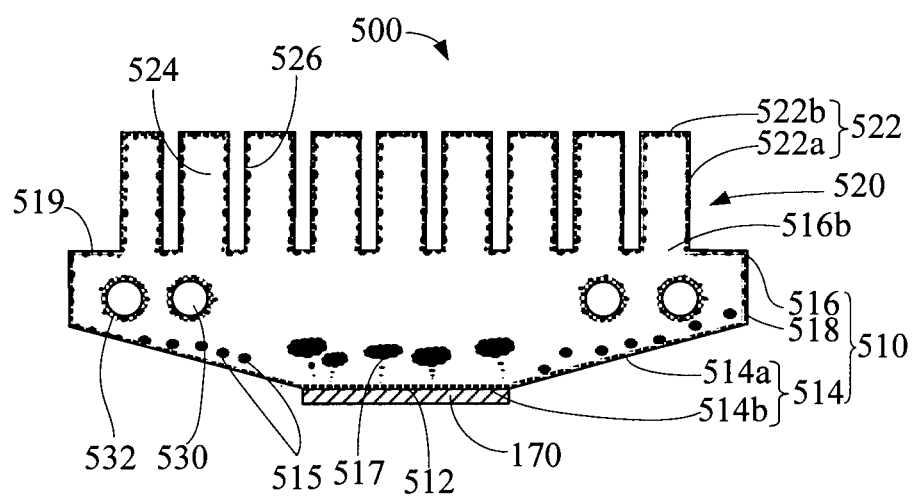
FIG. 6 is a cross section diagram of a heat dissipation device according to a fifth embodiment of the present disclosure.

FIG. 6 is a cross section diagram of a heat dissipation device 500 according to a fifth embodiment of the present disclosure. The heat dissipation device 500 includes a heat-sink base 510 and a set of fluid tube 530. The heat-sink base 510 includes a heat absorption area 512, configured to contact with a heat source 170 of an electronic device to absorb heat generated by the heat source 170. A heat-sink fin set 520 is formed on the heat-sink base 510, and the heat-sink fin set 520 includes multiple regularly arranged hollow heat dissipation members 522. Some structures in the heat dissipation device 500 according to the fifth embodiment of the present disclosure and some structures in the heat dissipation device 300 according to the third embodiment of the present disclosure are the same or similar, and as described above, like numerals are used to represent like components, so the structures and functions of like components in the fifth embodiment and the third embodiment are not repeated herein, and descriptions of the third embodiment may serve as a reference for details. Differences between the heat dissipation device 500 in the fifth embodiment and the heat dissipation device 300 of the third embodiment are as follows. A bottom plate 514 of the heat dissipation device 500 includes a fluid collecting plate 514a and a flowing back plate 514b connected to the fluid collecting plate 514a at an angle. The heat absorption area 512 is on the fluid collecting plate 514a. The construction and function of the bottom plate 514 of the heat dissipation device 500 are the same as those of the bottom plate 214 of the heat dissipation device 200 in the second embodiment, and are not repeated herein, and descriptions of the bottom plate 214 in the second embodiment may serve as a reference for details.

In the heat dissipation device according to the present disclosure, the fluid tube and the heat-sink base are combined with each other, which thereby improves the heat dissipation efficiency of the heat dissipation device and meanwhile decreases the risk that the failure of a single fluid tube causes failure of the entire heat dissipation device, and thereby increases the reliability of the heat dissipation device.

The above descriptions are merely exemplary embodiments of the present disclosure, but not intended to limit the present disclosure. Any modification, equivalent replacement, and improvement made within the spirit and principle of the present disclosure shall fall within the scope of the present disclosure.

What is claimed is:

1. A heat dissipation device, comprising:
a hollow heat-sink base and a fluid tube;
wherein: the fluid tube is inserted in the heat-sink base, and a cooling medium circulates in the fluid tube; and the heat-sink base comprises at least one heat absorption area configured to absorb heat, and a cooling fluid is received in the heat-sink base, wherein the cooling fluid is vaporized at the heat absorption area to absorb the heat taken by the heat absorption area, and condensed at a position that is inside the heat-sink base and away from the heat absorption area and on the fluid tube to release the absorbed heat;
wherein the heat-sink base is configured to form at least one sealed chamber, the cooling fluid is received in the chamber, and at least a portion of the fluid tube is disposed within the sealed chamber; and
wherein a fluid tube capillary structure is set on an outer wall of at least the portion of the fluid tube disposed within the chamber.

2. The heat dissipation device according to claim 1, wherein the heat-sink base comprises a bottom plate, a top plate corresponding to the bottom plate, and multiple side plates vertically connected the bottom plate with the top plate; the bottom plate, the top plate, and the side plates are hermetically interconnected and cooperatively form the at least one sealed chamber.

3. The heat dissipation device according to claim 2, wherein a capillary structure is set on inner walls of the chamber, and is configured to make the condensed cooling fluid flow back to the heat absorption area.

4. The heat dissipation device according to claim 3, wherein the at least the portion of fluid tube disposed in the chamber is suspended between the bottom plate and the top plate or supported on the bottom plate.

5. The heat dissipation device according to claim 4, wherein the fluid tube is of a serpentine shape bending back and forth or a straight line shape, or is of the serpentine shape bending back and forth in a heat concentration area in the chamber and the straight line shape elsewhere.

6. The heat dissipation device according to claim 3, further comprising a heat-sink fin set, wherein the heat-sink fin set is set on the top plate of the heat-sink base, and is configured to dissipate part of heat released during condensation of the cooling fluid to an ambient space of the heat-sink fin set.

7. The heat dissipation device according to claim 6, wherein the heat-sink fin set comprises multiple regularly arranged heat-sink fins, and the heat-sink fins are set on an outer surface of the top plate in a vertical manner.

8. The heat dissipation device according to claim 7, wherein the heat-sink fin set further comprises multiple heat dissipation plates, and the heat dissipation plates are connected with the adjacent heat-sink fins.

9. The heat dissipation device according to claim 3, wherein the bottom plate of the heat dissipation device comprises a fluid collecting plate and a flowing back plate connected to the fluid collecting plate at an angle, and the heat absorption area is on the fluid collecting plate.

10. The heat dissipation device according to claim 9, wherein the fluid collecting plate and the flowing back plate cooperatively form a cone, a radius of which decreases gradually in a vertical downward direction.

11. The heat dissipation device according to claim 3, wherein the heat-sink base further comprises a heat-sink fin set integrally formed with the heat-sink base, the heat-sink fin set comprises multiple hollow heat dissipation members arranged regularly at even intervals; each of the hollow heat dissipation members is formed by multiple vertical plates and a horizontal plate, the vertical plates of each of the hollow heat dissipation members are connected end to end in sequence to form a closed ring having openings at two ends, one end of the closed ring formed by the multiple vertical plates of each of the hollow heat dissipation members is vertically connected to the top plate of the heat-sink base, the horizontal plate is connected to the other end of the closed ring formed by the vertical plates, an accommodation space is formed between the horizontal plate and the vertical plates, the top plate of the heat-sink base corresponding to the accommodation spaces of the hollow heat dissipation members is opened with multiple openings, and the accommodation spaces of the hollow heat dissipation members are in communication with the steam chamber of the heat-sink base through the openings.

12. The heat dissipation device according to claim 11, wherein the at least the portion of fluid tube disposed in the chamber is suspended between the bottom plate and the top plate or supported on the bottom plate.

13. The heat dissipation device according to claim 11, wherein the fluid tube horizontally runs through opposite vertical plates of each of the hollow heat dissipation members.

14. The heat dissipation device according to claim 11, wherein the bottom plate of the heat dissipation device comprises a fluid collecting plate and a flowing back plate connected to the fluid collecting plate at an angle, and the heat absorption area is on the fluid collecting plate.

15. The heat dissipation device according to claim 14, wherein the fluid collecting plate and the flowing back plate cooperatively form a cone, a radius of which decreases gradually in a vertical downward direction.

16. An electronic equipment equipped with a heat dissipation device for cooling the electronic equipment, the heat dissipation device comprising:

a hollow heat-sink base and a fluid tube;
wherein: the fluid tube is inserted in the heat-sink base, and a cooling medium circulates in the fluid tube; and the heat-sink base comprises at least one heat absorption area configured to absorb heat, and a cooling fluid is received in the heat-sink base, wherein the cooling fluid is vaporized at the heat absorption area to absorb the heat taken by the heat absorption area, and condensed at a position that is inside the heat-sink base and away from the heat absorption area and on the fluid tube to release the absorbed heat;
wherein the heat-sink base is configured to form at least one sealed chamber, the cooling fluid is received in the chamber, and at least a portion of the fluid tube is disposed within the chamber; and
wherein a fluid tube capillary structure is set on an outer wall of at least the portion of the fluid tube disposed within the chamber.

17. A heat dissipation device, comprising:
a hollow heat-sink base configured to form at least one sealed chamber for receiving cooling fluid, the heat-sink base comprising at least one heat absorption area configured to absorb heat from an external source, wherein cooling fluid within the chamber is vaporized at the heat absorption area by absorbing heat in the heat absorption area and the vaporized cooling fluid is condensed and releases heat at a first position within the chamber away from the heat absorption area;
a fluid tube disposed at least partially within the chamber configured to carry a cooling medium and positioned at the first position to receive heat from the vaporized cooling fluid; and
a fluid tube capillary structure set on an outer wall of the fluid tube disposed within the chamber and configured to guide the condensed cooling fluid toward the heat absorption area.

18. The heat dissipation device according to claim 17 wherein a capillary structure is set on inner walls of the chamber and configured to guide the condensed cooling fluid flow towards the heat absorption area.

19. The heat dissipation device according to claim 17 wherein the at least the portion of fluid tube disposed in the chamber is suspended between a bottom plate and a top plate or supported on the bottom plate of the heat-sink base.

* * * * *